US008846431B2

(12) United States Patent
Xu

(10) Patent No.: US 8,846,431 B2
(45) Date of Patent: Sep. 30, 2014

(54) N-TYPE SILICON SOLAR CELL WITH CONTACT/PROTECTION STRUCTURES

(71) Applicant: Palo Alto Research Center Incorporated, Palo Alto, CA (US)

(72) Inventor: Baomin Xu, San Jose, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 14/271,410

(22) Filed: May 6, 2014

(65) Prior Publication Data
US 2014/0238484 A1    Aug. 28, 2014

Related U.S. Application Data

(62) Division of application No. 13/040,098, filed on Mar. 3, 2011.

(51) Int. Cl.
*H01L 21/00* (2006.01)
*H01L 31/0224* (2006.01)

(52) U.S. Cl.
CPC ............................ *H01L 31/022425* (2013.01)
USPC .............................................. 438/57; 136/255

(58) Field of Classification Search
CPC ............ H01L 31/042; H01L 31/02008; H01L 31/02021; H01L 31/02167; H01L 31/022425; H01L 31/022441; H01L 31/022458; H01L 25/045; H01L 25/047; H01L 27/1423; H01L 27/1422; H01L 27/1426; H01L 27/1428
USPC .................. 438/57, 66, 98; 136/244, 256, 255
See application file for complete search history.

(56) References Cited

U.S. PATENT DOCUMENTS

| 3,973,994 | A | 8/1976 | Redfield |
| 4,104,091 | A | 8/1978 | Evans, Jr. et al. |

(Continued)

FOREIGN PATENT DOCUMENTS

| CN | 1346517 A | 4/2002 |
| CN | 1211862 C | 7/2005 |

(Continued)

OTHER PUBLICATIONS

Cuevas et al. "50 Per Cent More Output Power from an Albedo-Collecting Flat Panel Using Bifacial Solar Cells", Solar Energy, vol. 29, No. 5, pp. 419-420, 1982.

(Continued)

*Primary Examiner* — Brook Kebede
(74) *Attorney, Agent, or Firm* — Bever, Hoffman & Harms, LLP; Patrick T. Bever

(57) ABSTRACT

A solar cell is formed on an n-type semiconductor substrate having a p+ emitter layer by forming spaced-apart contact/protection structures on the emitter layer, depositing a blanket dielectric passivation layer over the substrate's upper surface, utilizing laser ablation to form contact openings through the dielectric layer that expose corresponding contact/protection structures, and then forming metal gridlines on the upper surface of the dielectric layer that are electrically connected to the contact structures by way of metal via structures extending through associated contact openings. The contact/protection structures serve both as protection against substrate damage during the contact opening formation process (i.e., to prevent damage of the p+ emitter layer caused by the required high energy laser pulses), and also serve as optional silicide sources that facilitate optimal contact between the metal gridlines and the p+ emitter layer.

19 Claims, 6 Drawing Sheets

(56) References Cited

U.S. PATENT DOCUMENTS

| | | |
|---|---|---|
| 4,153,476 A | 5/1979 | Shelpuk |
| 4,205,216 A | 5/1980 | Douglas |
| 4,223,202 A | 9/1980 | Peters et al. |
| 4,330,680 A | 5/1982 | Goetzberger |
| 4,355,196 A | 10/1982 | Chai |
| 4,479,027 A | 10/1984 | Todorof |
| 4,533,814 A | 8/1985 | Ward |
| 4,540,843 A | 9/1985 | Gochermann et al. |
| 4,589,191 A | 5/1986 | Green et al. |
| 4,602,120 A | 7/1986 | Wakefield et al. |
| 4,609,037 A | 9/1986 | Wheeler et al. |
| 4,640,001 A | 2/1987 | Koiwai et al. |
| 4,650,294 A | 3/1987 | Nanno et al. |
| 4,664,945 A | 5/1987 | Maeda et al. |
| 4,796,038 A | 1/1989 | Allen et al. |
| 4,826,777 A | 5/1989 | Ondris |
| 4,896,015 A | 1/1990 | Taboada et al. |
| 4,933,623 A | 6/1990 | Fox |
| 4,996,405 A | 2/1991 | Poumey et al. |
| 5,011,565 A | 4/1991 | Dube et al. |
| 5,029,955 A | 7/1991 | Chu |
| 5,075,281 A | 12/1991 | Testardi |
| 5,151,377 A | 9/1992 | Hanoka et al. |
| 5,213,628 A | 5/1993 | Noguchi et al. |
| 5,296,671 A | 3/1994 | Torii et al. |
| 5,356,488 A | 10/1994 | Hezel |
| 5,449,413 A | 9/1995 | Beauchamp et al. |
| 5,468,652 A | 11/1995 | Gee |
| 5,530,418 A * | 6/1996 | Hsu et al. .................... 338/307 |
| 5,538,563 A | 7/1996 | Finkl |
| 5,543,333 A | 8/1996 | Holdermann |
| 5,569,399 A | 10/1996 | Penney et al. |
| 5,665,175 A | 9/1997 | Safir |
| 5,751,436 A | 5/1998 | Kwon et al. |
| 5,863,338 A | 1/1999 | Yamada et al. |
| 5,916,461 A | 6/1999 | Costin et al. |
| 5,929,530 A | 7/1999 | Stone |
| 5,981,902 A | 11/1999 | Arita et al. |
| 5,990,413 A | 11/1999 | Ortabasi |
| 6,032,997 A | 3/2000 | Elliott et al. |
| 6,072,157 A | 6/2000 | Klebanoff et al. |
| 6,164,633 A | 12/2000 | Mulligan et al. |
| 6,180,869 B1 | 1/2001 | Meier et al. |
| 6,183,186 B1 | 2/2001 | Howells et al. |
| 6,185,030 B1 | 2/2001 | Overbeck et al. |
| 6,203,621 B1 | 3/2001 | Tran et al. |
| 6,232,217 B1 | 5/2001 | Ang et al. |
| 6,291,763 B1 | 9/2001 | Nakamura |
| 6,310,281 B1 | 10/2001 | Wendt et al. |
| 6,323,415 B1 | 11/2001 | Uematsu et al. |
| RE37,512 E | 1/2002 | Szlufcik et al. |
| 6,351,098 B1 | 2/2002 | Kaneko |
| 6,354,791 B1 | 3/2002 | Wytman et al. |
| 6,410,843 B1 | 6/2002 | Kishi et al. |
| 6,413,113 B2 | 7/2002 | Uher et al. |
| 6,429,037 B1 | 8/2002 | Wenham et al. |
| 6,459,418 B1 | 10/2002 | Comiskey et al. |
| 6,555,739 B2 | 4/2003 | Kawam |
| 6,628,446 B1 | 9/2003 | Shahar et al. |
| 6,667,434 B2 | 12/2003 | Morizane et al. |
| 6,924,493 B1 | 8/2005 | Leung |
| 6,979,798 B2 | 12/2005 | Gu et al. |
| 7,002,675 B2 | 2/2006 | MacGibbon et al. |
| 7,129,592 B1 | 10/2006 | Yetter |
| 7,388,147 B2 | 6/2008 | Mulligan et al. |
| 7,394,016 B2 | 7/2008 | Gronet |
| 2001/0008230 A1 | 7/2001 | Keicher et al. |
| 2001/0050404 A1 | 12/2001 | Saito et al. |
| 2002/0060208 A1 | 5/2002 | Liu et al. |
| 2002/0079445 A1 | 6/2002 | Hantschel et al. |
| 2002/0127953 A1 | 9/2002 | Doan et al. |
| 2002/0154396 A1 | 10/2002 | Overbeck |
| 2003/0095175 A1 | 5/2003 | Agorio |
| 2003/0099022 A1 | 5/2003 | Karin et al. |
| 2003/0129810 A1 | 7/2003 | Barth et al. |
| 2003/0213429 A1 | 11/2003 | Kreuzer |
| 2004/0012676 A1 | 1/2004 | Weiner |
| 2004/0048001 A1 | 3/2004 | Kiguchi et al. |
| 2004/0200520 A1 | 10/2004 | Mulligan et al. |
| 2005/0000566 A1 | 1/2005 | Posthuma et al. |
| 2005/0133084 A1 | 6/2005 | Joge et al. |
| 2005/0212139 A1 | 9/2005 | Leinikka et al. |
| 2005/0221613 A1 | 10/2005 | Ozaki et al. |
| 2005/0253308 A1 | 11/2005 | Sherwood |
| 2006/0046269 A1 | 3/2006 | Thompson et al. |
| 2006/0076105 A1 | 4/2006 | Furui et al. |
| 2006/0130891 A1 | 6/2006 | Carlson |
| 2006/0251796 A1 | 11/2006 | Fellingham |
| 2006/0266235 A1 | 11/2006 | Sandhu et al. |
| 2008/0116183 A1 | 5/2008 | Curry |
| 2008/0138456 A1* | 6/2008 | Fork et al. .................... 425/113 |

FOREIGN PATENT DOCUMENTS

| | | |
|---|---|---|
| DE | 29824597 U1 | 9/2001 |
| EP | 0257157 A | 3/1988 |
| EP | 0851511 A | 7/1998 |
| EP | 1145797 A | 10/2001 |
| EP | 1351318 A | 10/2003 |
| EP | 1763086 A | 3/2007 |
| EP | 1833099 A | 9/2007 |
| EP | 1925964 A1 | 5/2008 |
| GB | 394285 A | 6/1933 |
| JP | 02055689 A | 2/1990 |
| JP | 02-187291 A | 7/1990 |
| JP | 7-326786 A | 12/1995 |
| JP | 11-214725 A | 8/1999 |
| JP | 2002111035 A | 4/2002 |
| JP | 2003124483 A | 4/2003 |
| JP | 2004-228450 A | 8/2004 |
| JP | 2004266023 A | 9/2004 |
| JP | 2005-236235 A | 9/2005 |
| JP | 2008066316 A | 3/2008 |
| WO | 91/08503 A | 6/1991 |
| WO | 92/15845 A | 9/1992 |
| WO | 97/21253 A | 6/1997 |
| WO | 97/48519 A | 12/1997 |
| WO | 98/54602 A2 | 12/1998 |
| WO | 02/052250 A | 7/2002 |
| WO | 03/047005 A | 6/2003 |
| WO | 2005076960 A2 | 8/2005 |
| WO | 2006/097303 A1 | 9/2006 |
| WO | 2007/088529 A1 | 8/2007 |

OTHER PUBLICATIONS

Taguchi et al. "An Approach for the Higher Efficiency in the HIT Cells", IEEE, pp. 866-871, 2005.

Kerschaver et al. "Back-contact Solar Cells: A Review", Progress in Photovoltaics: Reseach and Applicatons, 2006, vol. 14, pp. 107-123.

Kranzl et al. "Bifacial Solar Cells on Multi-Crystalline Silicon", 15th International Photovoltaic Science & Engineering Conference, Shanghai, China, 2 pages, 2005.

Mauk et al. "Buried Metal/Dielectric/Semiconductor Reflectors for Light Trapping in Epitaxial Thin-Film Solar Cells", May 1996, IEEE, 25th PVSC, pp. 147-150.

Ruthe et al. "Etching of CuInSe2 Thin Films—Comparison of Femtosecond and Picosecond Laser Ablation", Applied Surface Science, vol. 247, No. 1-4, Jul. 15, 2005, pp. 447-452.

Kenis et al. "Fabrication inside Microchannels Using Fluid Flow", Accounts of Chemical Research, vol. 33, No. 12, 2000, pp. 841-847.

Hitachi: Offering Total Environmental Solutions, Environmental Activities, http://greenweb.hitachi.co.jp/en/sustainable/total-solution.html, 5 pages, 2003.

Neuhaus et al. "Industrial Silicon Wafer Solar Cells", Advances in OptoElectronics, vol. 2007, 2007, 15 pages.

Recart et al. "Large Area Thin BSF Solar Cells With Simultaneously Diffused Boron and Phosphorus Screen Printed Emitters", IEEE, pp. 1213-1216, 2005.

Szlufcik et al. "Low-Cost Industrial Technologies of Crystalline Silicon Solar Cells", Proc. of the IEEE, vol. 85, No. 5, May 1, 1997, pp. 711-730.

(56) References Cited

OTHER PUBLICATIONS

Cousins et al. "Manufacturing and Design Issues for Thin Silicon Solar Cells Manufactured on FZ(B), MCZ(B), CZ (Ga) and CZ(B) Wafers", IEEE, pp. 987-990, 2005.
Weber et al. "Modelling of Sliver® Modules Incorporating a Lambertian Rear Reflector", The Australian National University, Canberra ACT 0200, Australia, 4 pages, 2005.
Brogren et al. "Optical properties, durability, and system aspects of a new aluminum-polymer-laminated steel reflector for solar concentrators", Jan. 2004, Solar Energy Materials and Solar Cells, 82, pp. 387-412.
Nijs et al. "Overview of solar cell technologies and results on high efficiency multicrystalline silicon substrates", Solar Energy Materials and Solar Cells, vol. 48, No. 1-4, Nov. 1, 1997, pp. 199-217.
Sanyo Solar Panels, Sanyo HIT Solar Panel Discount—Solar Electric Supply, Sanyo Solar Modules, http://www.solarelectricsupply.com/Solar_Panels/Sanyo/sanyo.html, 4 pages, 2005.
SunPower Corp. News Release, May 12, 2008, Available URL: http://investors.sunpowercorp.com/releasedetail.cfm?ReleaseID=309613.
Munzer et al. "Thin Monocrystalline Silicon Solar Cells", Oct. 1999, IEEE Transactions on Electron Devices, vol. 46, No. 10, pp. 2055-2061.
Sundararajan et al. "Three-Dimensional Hydrodynamic Focusing in Polydimethylsiloxane (PDMS) Microchannels", Journal of Microelectromechanical Systems, vol. 13, No. 4, Aug. 2004, pp. 559-567.

\* cited by examiner

N-TYPE SILICON SOLAR CELL WITH CONTACT/PROTECTION STRUCTURES

RELATED APPLICATIONS

This application is a divisional of U.S. patent application Ser. No. 13/040,098, entitled "N-Type Silicon Solar Cell With Contact/Protection Structures" filed Mar. 3, 2011.

FIELD OF THE INVENTION

This invention relates to solar cells, and more particularly to solar cells fabricated on n-type silicon wafers.

BACKGROUND OF THE INVENTION

Increasing solar cell efficiency is one of the most important goals for the solar cell research community, with the goal of enabling the lowest possible cost per watt for a given solar cell. A majority of current solar cells are fabricated on p-type Czochralski (Cz) silicon wafers with an n+ emitter layer. A problem with these conventional p-type silicon solar cells is that they suffer from light induced degradation and lower tolerance to metal impurities, which limits their efficiency to lower than 20%. As such, the particular goal of the solar cell research community is to develop high efficiency silicon solar cells having target efficiencies higher than 20%.

One approach currently being considered by the solar cell research community for achieving the >20% target efficiency is to use n-type silicon wafers with a p+ emitter layer in place of the currently used p-type wafers. N-type silicon wafers are known to avoid light induced degradation and have a higher tolerance to metal impurities than p-type silicon wafers, and therefore are believed to provide a solution for producing higher efficiency solar cells.

A problem currently faced by the solar cell research community in fabricating solar cells on n-type silicon wafers is finding a suitable dielectric material that can both passivate the p+ emitter layer, and can also be appropriately patterned to provide electrical connection to selected regions of the p+ emitter layer. The passivation (dielectric) layers on current solar cells fabricated on p-type wafers typically include silicon-nitride ($SiN_X$) that is deposited using plasma-enhanced chemical vapor deposition (PECVD). Unfortunately, while PECVD deposited $SiN_X$ dielectric layer can effectively passivate the n+ emitter layer on p-type silicon wafers and has been used in mass production for many years, PECVD deposited $SiN_x$ cannot be used as a passivation layer on the p+ emitter layer of n-type silicon wafers because SiNx can only provide a positive fixed charge density, and thus can only passivate the surface where the minority carrier is holes (positive charger, that is n+ surface).

Recent study has proved that aluminum oxide ($Al_2O_3$) that is deposited using an atomic layer deposition (ALD) process is one of the most promising materials to passivate the p+ emitter of an n-type solar cell, and as such there has been a significant amount of research on ALD deposited $Al_2O_3$ in the past a couple of years. That is, in order to compete with the very low labor costs available to Asian companies, Western solar cell manufacturers are forced to adopt high efficiency solar cell production processes, and the formation of passivation layers using ALD deposited $Al_2O_3$ is believed to be one of the critical technologies for allowing high efficiency silicon solar cell production. Moreover, ALD deposited $Al_2O_3$ dielectric film can also effectively passivate the n+ emitter layer as well, making it very promising for high efficiency interdigitated back contact (IBC) solar cells where both p+ and n+ emitter layers are on the same side (backside) and need to be passivated simultaneously.

The current problem facing the solar cell research community in utilizing ALD deposited $Al_2O_3$ dielectric films is that, unlike PECVD deposited $SiN_x$ dielectric layers, silver paste can not fire through the ALD deposited $Al_2O_3$ layer to make the metal contact with the underlying p+ emitter layer. Currently, most of the cells made in laboratory use photolithography method to make contact openings through the $Al_2O_3$ layer, but this approach cannot be used in mass production due to the intrinsic high cost associated with the use of photolithography. Thus, how to achieve low-cost metallization through $Al_2O_3$ passivation layer is one of the bottlenecks for the mass production of high efficiency solar cells passivated with $Al_2O_3$.

What is needed is a low cost method for facilitating the mass production of high efficiency n-type silicon solar cells with the p+ emitter layers that addresses the problems set forth above. What is also needed are mass produced, high efficiency n-type silicon solar cells with p+ emitter layers that are manufactured using the method.

SUMMARY OF THE INVENTION

The present invention is directed to a method for facilitating the mass production of high efficiency, low cost n-type silicon solar cells with the p+ emitter layers that addresses the problems set forth above by forming contact/protection film structures on the p+ emitter layer using a print-type deposition and/or direct marking method (e.g., ink jet, screen printing, extrusion, etc.), depositing a blanket passivation layer (e.g., ALD deposited $Al_2O_3$), utilizing a non-photolithography patterning method (e.g., laser ablation, inkjet or screen print etching solution or paste) to form contact openings that expose the contact/protection structures, and then using a print-type deposition and/or direct marking method (e.g., ink jet, screen printing, extrusion, etc.) to form contact via structures in the contact openings and metal gridlines structures that are supported on the passivation layer. This method solves the passivation/metallization problem associated with n-type solar cells using of ALD deposited $Al_2O_3$ because the contact/protection structures prevent damage to the wafer during formation of the contact openings by, e.g., laser ablation. That is, by placing an initial, compatible contact/protection layer on the p+ emitter material prior to passivation, a buffer is created that can eliminate damage to the emitter layer even when high-power laser ablation is utilized to form the contact openings through the passivation layer, thereby facilitating the use of high efficiency ALD deposited $Al_2O_3$. Metal gridlines can then be formed that contact the p+ emitter layer through the contact openings formed in the ALD deposited $Al_2O_3$, and then a firing step is performed to finish the metallization process. The same method may also be used to produce low-cost p-type solar cells with n+ emitter layers.

The present invention is also directed to a solar cell formed on a silicon wafer including spaced-apart contact structures disposed on an upper emitter layer, a dielectric passivation layer (e.g., ALD deposited $Al_2O_3$) disposed on the contact structures and other "exposed" portions of the emitter layer, metal gridlines disposed on the passivation layer, and metal via structures extending through associated contact openings defined in the passivation layer such that each metal via structure electrically connects an associated metal gridline to an associated contact structure, where the solar cell is characterized in that the contact structures have minimum lateral dimensions larger than the maximum lateral dimension of their corresponding contact openings (e.g., the X-axis width of each contact structure is greater than the X-axis width of each corresponding contact opening). Forming each of the contact structures to have minimum lateral dimensions that are greater than the corresponding maximum lateral dimensions of the contact opening facilitates reliable formation of the contact openings without damaging the underlying emitter layer, e.g., when the laser beam pulse is slightly off target. In one embodiment, the substrate includes a n-type body layer and a p+ emitter layer disposed between the upper substrate surface and the n-type body layer, and in an alternative embodiment the substrate includes a p-type body layer and a n+ emitter layer.

In accordance with an aspect of the present invention, the contact/protection structures serve both the purpose of protecting the underlying wafer from damage during formation of the contact openings, and also serve as contact structures for facilitating low resistance electrical connection between the metal gridlines and the emitter layer, and/or form a selective emitter structure. In one specific embodiment the contact/protection structures include a silicide forming metal (e.g., Ni, Co, Ti) that forms silicide structure at the metal/emitter junction. In another specific embodiment the contact/protection structures comprise aluminum disposed on the first portions of the upper surface, and a silicide-forming metal disposed on the aluminum, and the aluminum will diffuse into the p+ emitter layer to form the p++ selective emitter structure. According to another aspect, the contact/protection structures are optionally printed in a spaced-apart arrangement on the p+ emitter layer, e.g., in the form of dot-structures, continuous line structures, or dashed-line structures.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in n-type solar cells. The following description is presented to enable one of ordinary skill in the art to make and use the invention as provided in the context of a particular application and its requirements. As used herein, directional terms such as "upper", "upwards", "lower", "downward", "front", "rear", are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
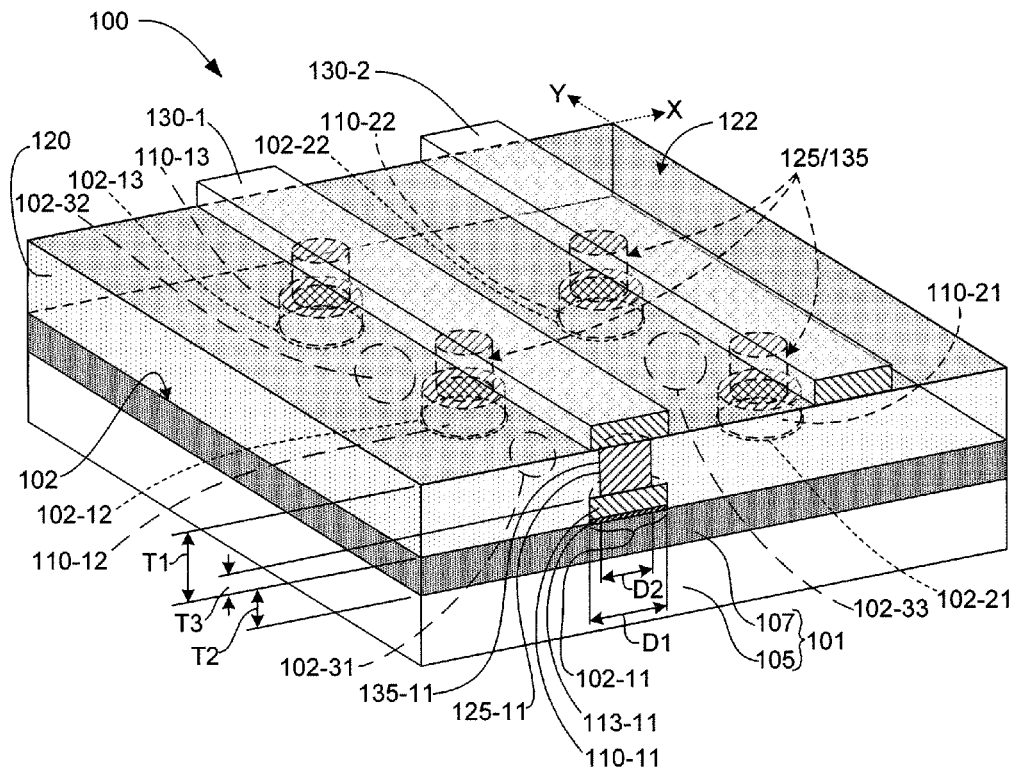
FIG. 1 is a top side partial cross-sectional perspective view showing a portion of a solar cell produced in according to a specific embodiment of the present invention.

FIG. 1 is a partial perspective cut-away top view showing a solar cell 100 that is produced in accordance with an embodiment of the present invention. Similar to conventional solar cells, solar cell 100 is formed on a silicon wafer (substrate) 101 having an upper surface 102, and includes a dielectric passivation layer 120 disposed over upper surface 102, metal gridlines 130-1 and 130-2 disposed on an upper surface 122 of passivation layer 120, and metal via structures 135 that extend through associated openings 125 defined in passivation layer 120 such that each metal via structure (e.g., 135-11) electrically connects an associated metal gridline (e.g., gridline 130-1) to an associated region (e.g., region 102-11) of upper surface 102.

According to an aspect of the present embodiment, solar cell 100 is formed on an n-type silicon wafer (substrate) 101 including an n-type body (lower) region 105 and a p+ emitter (upper) layer 107. As indicated in FIG. 1, p+ emitter layer 107 is disposed between the n-type body region 105 and upper surface 102, and extends up to and includes upper surface 102. An advantage of using n-type silicon wafers are known to avoid light induced degradation and have a higher tolerance to metal impurities than p-type silicon wafers, and therefore are believed to produce higher efficiency solar cells. However, novel aspects of the present invention may also be applied to p-type silicon wafers (substrates), e.g., where body region 105 comprises a p-type semiconductor material and emitter layer 107 comprises an n+ doping concentration. Therefore, the appended claims are not intended to be restricted to n-type silicon wafers (substrates) 101 unless the phrase "n-type silicon" is specified.

According to another aspect of the present invention, solar cell includes spaced-apart contact structures 110-11, 110-12, 110-13, 110-21 and 110-22, which, in the present embodiment, are deposited in the form of dot (e.g., round or oval) structures over corresponding first portions 102-11, 102-12, 102-13, 102-21 and 102-22 of the upper surface 102, respectively. Note that spaced-apart contact structures 110-11, 110-12, 110-13 are aligned under gridline 130-1, and spaced-apart contact structures 110-21 and 110-22 are aligned under gridline 130-2, which is parallel to gridline 130-1. Note also that adjacent spaced-apart contact structures are separated by (second) regions of upper surface 102 that are entirely covered by passivation layer 120 (e.g., contact structures 110-11 and 110-12 are separated by region 102-31, contact structures 110-12 and 110-13 are separated by region 102-32, and contact structures 110-21 and 110-22 are separated by region 102-33).

According to another aspect of the invention, contact structures 110-11 to 110-22 are disposed prior to formation of blanket dielectric passivation layer 120 such that dielectric passivation layer 120 is disposed at least partially on contact structures 110-1 and 110-2. That is, because blanket dielectric passivation layer 120 is formed after contact structures 110-11 to 110-22, at least a portion of the upper surface of each contact structures 110-1 and 110-2 is contacted by and disposed under a corresponding portion of passivation layer 120.

According to yet another aspect of the invention, contact structures 110-11 to 110-22 are disposed prior to formation of openings 125 and via structures 135 such that each via structure 135 (e.g., via structure 135-11) electrically connects an associated metal gridline (e.g., gridline 130-1) and an associated contact structure (e.g., contact structure 110-11). In the present embodiment, contact structures 110-11 to 110-22 function both to enhance an electrical connection between via structures 135 and p+ emitter layer 107, and to prevent damage to substrate 101 (e.g., p+ emitter layer 107) during formation of openings 125. To facilitate the contact function, each contact structure 110-11 to 110-22 comprises a conductive metal that is deposited directly on upper surface portions 102-11 and 102-12. The conductive contact metal can be either the same as or the different from material subsequently used to form gridlines 130-1 and 130-2. In accordance with a specific embodiment, each contact structure 110-12 to 110-22 comprises a silicide-forming metal (e.g., Nickel, Cobalt, or Titanium) such that optional silicide structures (e.g., 113-1 and 113-2 are formed along the interface between each contact structure 110-1 and 110-2 and first portions 102-11 and 102-12 of the upper surface 102, respectively. In yet another specific embodiment, each spaced-apart contact structure 110-1 and 110-2 comprises an aluminum layer disposed on upper surface portions 102-11 and 102-12, and a silicide-forming metal (e.g., Ni, Co, Ti) layer disposed on the aluminum layer, such that optional p++ emitter structures (not shown) are formed along the interface between each contact structure 110-1 and 110-2 and the first portions of 102-11 and 102-12 of the upper surface 102, respectively. To facilitate the protection function, each contact structure has a minimum lateral dimension (i.e., measured in the same direction parallel to the plane defined by upper surface 102) that is larger than the maximum lateral dimension of the contact openings in the corresponding direction (e.g., as shown in FIG. 1, the minimum diameter D1 measured in the X-axis direction of dot-type contact structure 110-11 is larger than the maximum diameter D2 of corresponding contact opening 125-11, also measured in the X-axis direction). As described below, by forming contact structures 110-11 to 110-22 with minimum lateral dimensions that are substantially larger than the maximum lateral dimensions of their associated contact openings 125-11 to 125-22, the contact structures reliably serve to prevent damage to substrate 101 when the contact openings are formed, e.g., by laser ablation.

According to a presently preferred embodiment of the present invention, passivation layer 120 is formed by ALD deposited $Al_2O_3$. As mentioned above, a benefit of providing contact structures 110-11 to 110-22 between metal gridlines 130-1/2 and p+ emitter layer 107 is that the contact structures serve to protect substrate 101 during formation of openings through passivation layer 120, thereby facilitating the use of high energy laser pulses to ablate selected portions of passivation layer 120 in order to form contact openings 125 without damaging p+ emitter layer 107. The present inventors have determined that laser ablation process is well-suited for generating contact openings through ALD deposited $Al_2O_3$, but may cause significant damage to upper surface 102 that could prevent suitable connection between the subsequently formed metal gridlines 130-1 and 130-2 and p+ emitter layer 107. By providing contact structures 110-11 to 110-22 on upper surface 102 as a protective structure, laser energy passing entirely through passivation layer 120 is prevented from reaching upper surface 102 by these contact structures, thereby greatly reducing the chance of damage to p+ emitter layer 107 during the laser ablation process, and thereby facilitating the formation of passivation layer 120 using ALD deposited $Al_2O_3$, which in turn facilitates the low cost production of high efficiency solar cells on n-type silicon wafers.

Figure 2:
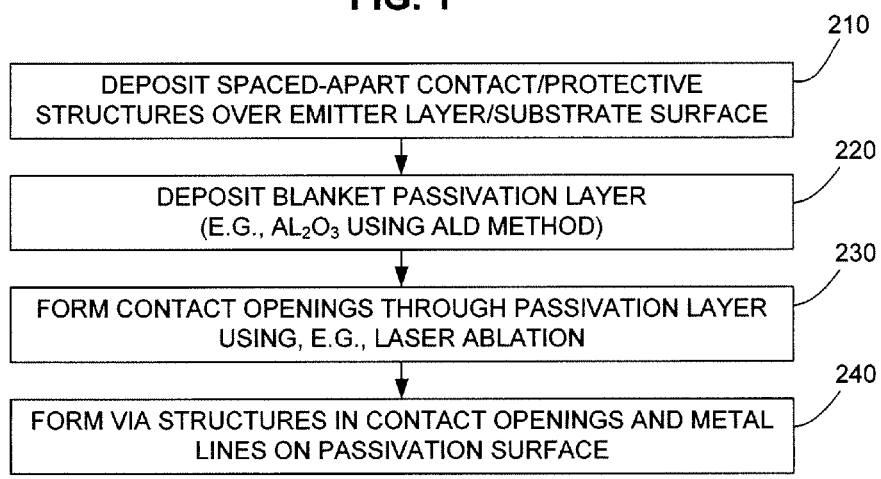
FIG. 2 is a flow diagram showing a generalized method for producing solar cells in accordance with another embodiment of the present invention.

FIG. 2 is a flow chart showing a generalized method for producing solar cells (or other electrical circuits) on a silicon substrate having an emitter layer according to an embodiment of the present invention. Although the present invention is described herein with particular reference to the formation of solar cells on n-type silicon wafers having p+ emitter layers, the method shown in FIG. 2 may also be utilized to form solar cells on p-type silicon wafers having n+ emitter layers. Further, the method shown in FIG. 2 may also be used to form other electrical circuits that would benefit from the use of a low cost blanket passivation layer such as ALD deposited $Al_2O_3$.

Referring to the upper portion of FIG. 2, the generalized method begins by depositing spaced-apart contact/protection structures on the upper surface of the silicon wafer (block 210). In one embodiment, to facilitate the contact function described above, the spaced-apart contact/protection structures may be formed using a contact metal such as aluminum, a silicide-forming metal, a combination of contact and silicide forming metals. In an alternative embodiment, the spaced-apart contact/protection structures may be formed using a sacrificial material such as an organic material that serves the protection function described above, and is then removed (e.g., fully removed by the laser ablation or using a suitable etchant) after forming the contact openings and prior to forming the metal gridlines/vias. In accordance with an aspect of the present invention, the spaced-apart contact/protection structures are formed using a printing method (e.g., inkjet printing or screen printing) or another non-lithographic method in order to avoid the high production costs associated with photolithography.

After forming the spaced-apart contact/protection structures, a blanket dielectric passivation layer is deposited over the contact structures and over the remaining exposed portions of the upper surface (block 220, see FIG. 2). In a presently preferred embodiment, the process of forming the blanket passivation layer comprises depositing a thin layer $Al_2O_3$, using an ALD process, which is known in the art. In an alternative embodiment, the blanket passivation layer is formed using another dielectric material such as silicon oxide, which can be formed by using sputtering, CVD or thermal growth.

After formation of the dielectric layer, contact openings are formed through the dielectric passivation layer such that each contact opening exposes a portion of a corresponding contact structure (block 230, FIG. 2). In accordance with an aspect of the present invention, the contact openings are formed using a laser ablation method or another non-lithographic method (e.g., inkjet or screen printing etching solution or etching paste) in order to avoid the high production costs associated with photolithography. Laser ablation is currently preferred for forming the contact openings because it is believed the laser can be suitably targeted and controlled to ablation dielectric material disposed over the contact structures, and it is a dry, fast, clean and non-contact method to form the contact openings. In accordance with a specific embodiment, the laser is directed onto portions of the passivation disposed over each contact structure (e.g., see contact structure 110-11 in FIG. 1), and the laser beam is shaped such that the maximum lateral dimension of the contact opening (e.g., opening 125-11 having lateral dimension D2 in FIG. 1) formed by the ablation process is smaller than the minimum lateral dimension of the underlying contact structure (e.g., lateral dimension D1 of contact structure 110-11; shown in FIG. 1).

After forming the contact openings, metal gridlines are formed on the upper surface of the dielectric layer such that each metal gridline is electrically connected to the substrate's upper surface by way of at least one via structure that extends through an associated contact opening (block 240, FIG. 2). In accordance with an aspect of the present invention, the metal gridlines are formed using a printing method (e.g., inkjet printing or screen printing) or another non-lithographic method in order to avoid the high production costs associated with photolithography. In an alternative embodiment, gridlines are formed using the co-extrusion process described, for example, in co-owned and co-pending U.S. patent application Ser. No. 12/266,974, entitled Micro-Extrusion Printhead Nozzle With Tapered Cross-Section, which is incorporated herein by reference in its entirety. Note that when the contact structures are retained after forming the contact openings, a lower end of each via structures contacts the upper surface of an associated contact structure, and electrical connection between the metal gridlines and the substrate is made by way of the contact structures. Alternatively, when the contact structures are formed using sacrificial material that is removed after the contact openings are formed, the lower end of each via structures contacts the substrate's upper surface, or contacts another material disposed on the upper substrate surface (e.g., a material deposited into the contact openings or after the sacrificial material is removed).

FIGS. 3(A) to 3(G) are simplified cross-sectional side views illustrating a method for producing a solar cell according to an exemplary embodiment of the present invention.

Figure 3A:
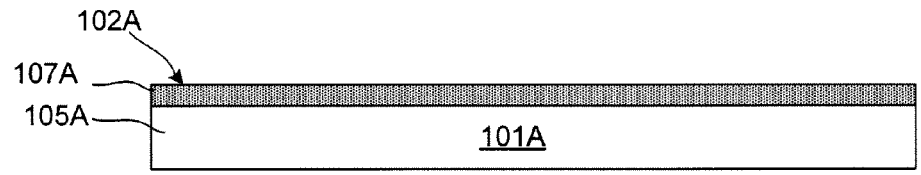
FIGS. 3(A), 3(B), 3(C), 3(D), 3(E) and 3(F) are simplified cross-sectional side views showing a portion of a solar cell during production according to an exemplary specific embodiment of the present invention.

FIG. 3(A) shows an exemplary silicon wafer/substrate 101A at the start of the production method. Silicon wafer/substrate 101A includes an upper surface 102A and has an n-type bulk body 105A with a thin p+ emitter 107A layer formed between upper surface 102A and bulk body 105A using methods well-known in the art such as boron diffusion.

Figure 3B:
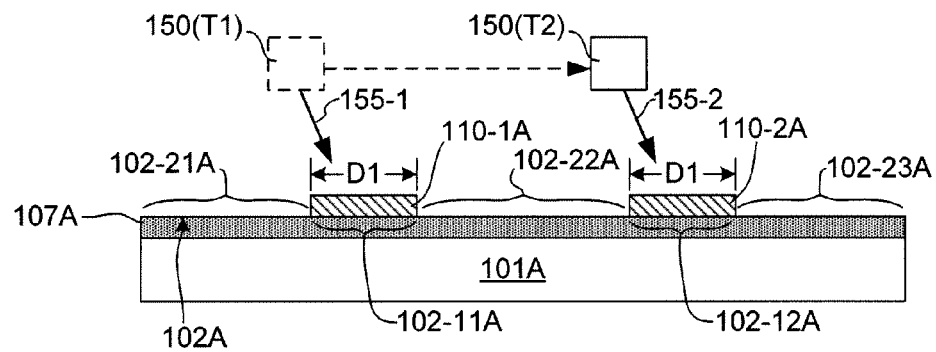

FIG. 3(B) is a simplified diagram illustrating the formation of spaced-apart contact structures 110-1A and 110-2A on p+ emitter layer 107A using an inkjet head 150 that is positioned over upper surface 102A and caused to move relative to substrate 101A and to eject a metal-bearing ink, in the form such as a liquid ink or a paste, onto upper surface regions 102-11A and 102-12A. In the disclosed embodiment, at a first time (T1) inkjet head 150 is positioned over surface region 102-11A and actuated to eject a first ink quantity 155-1 such that contact structure 110-1A is formed on substrate 101A. Inkjet head 150 is then moved such that, at a second time (T2), inkjet head 150 is positioned over surface region 102-12A, and is then actuated to eject a second ink quantity 155-2 that produces contact structure 110-2A. Note that the remaining portions 102-21A, 102-22A and 102-23A of upper surface 102A remain exposed, with contact structures 110-1A and 110-2A being separated by exposed region 102-22A. In alternative embodiments substrate 101A maybe moved relative to inkjet head 150. In one specific embodiment contact structures 110-1A and 110-2A are printed such that they have a thickness of about 100 nm to about 5 µm. In another specific embodiment, contact structures 110-1A and 110-2A are formed using the same metal (e.g., silver) that is subsequently used to form the metal gridlines. In a presently preferred embodiment, contact structures 110-1A and 110-2A are formed using a metal that can form low contact resistance with silicon, such as the silicide forming metals Ni, Co, and Ti. In yet another embodiment, an acceptor metal such as Al is printed onto surface regions 102-11A and 102-12A, and then a silicide-forming metal such as Ni is printed onto the acceptor metal. The advantage using a two-layer metal structure is that, during firing the acceptor metal (e.g., Al) diffuses into the p+ emitter layer to form a p++ selective emitter structure, and the silicide forming metal also forms a very low contact resistance interface to the emitter structure, which further increases the solar cell's efficiency. Alternatively, the contact structure can also be formed by using the ink that only contains an acceptor metal such as Al.

Figure 3C:
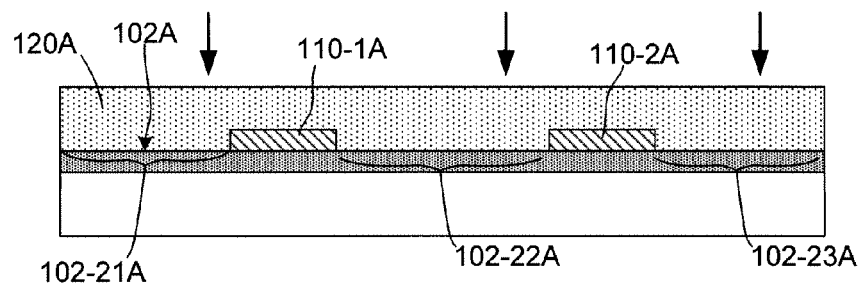

FIG. 3(C) is a simplified diagram illustrating the deposition of a blanket $Al_2O_3$ passivation layer 120A over the contact structures 110-1A and 110-2A and remaining exposed portions 102-21A, 102-22A and 102-23A of upper surface 102A using an atomic layer deposition (ALD) method according to known techniques. An optional anneal is performed after forming blanket $Al_2O_3$ passivation layer 120A. Alternatively, a separate passivation annealing process is not used, and $Al_2O_3$ dielectric layer 120A is annealed together with the gridline metal firing process (discussed below).

Figure 3D:
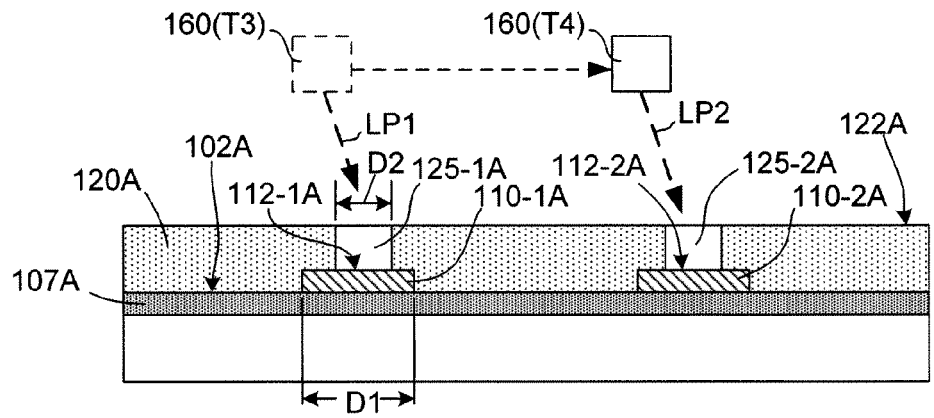

FIG. 3(D) is a simplified diagram illustrating the formation of contact openings 125-1A and 125-2A through $Al_2O_3$ passivation layer 120A such that each contact opening 125-1A and 125-2A respectively exposes an upper surface portion 112-1A and 112-2A of corresponding contact structures 110-1A and 110-2A. In the disclosed embodiment, at a third time (T3) laser head 160 is positioned over contact structure 110-1A and is actuated to generate a laser pulse LP1 that removes a portion of $Al_2O_3$ passivation layer 120A, thereby forming contact opening 125-1A. Note that laser head 160 is controlled such that opening 125-1A has a maximum diameter (lateral dimension) D2 that is smaller than the minimum diameter (lateral dimension) D1 of contact structure 110-1A. At subsequent time T4, laser head 160 is then moved such that laser head 160 is positioned over contact structure 110-2A, and is then actuated to generate a pulse LP2 that produces contact opening 125-2A, thereby exposing a portion of upper surface 112-2A. In alternative embodiments substrate 101A maybe moved relative to laser head 160, or a suitable scanning mechanism (e.g., a rotating mirror, Galva scanning or polygon scanning) may be used to direct laser pulses LP1 and LP2 to their target regions.

Figure 3E:
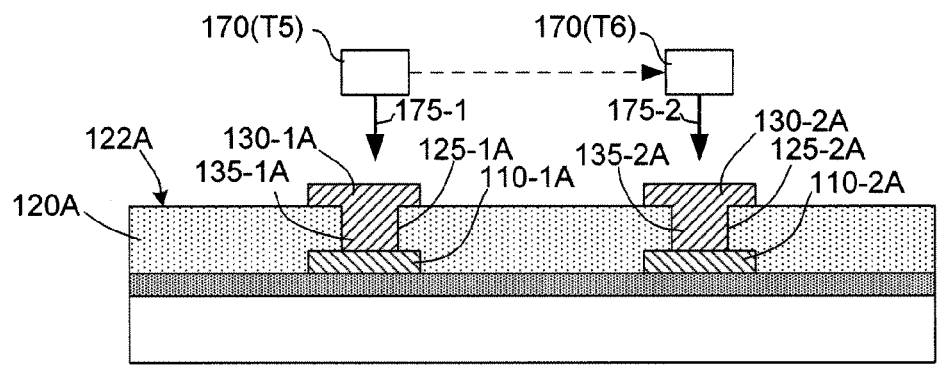

FIG. 3(E) is a simplified diagram illustrating the subsequent formation of metal gridlines 130-1A and 130-2A on upper surface 122A of $Al_2O_3$ passivation layer 120A such that each metal gridline (e.g., gridline 130-1A) is electrically connected to a corresponding contact structure (e.g., contact structure 110-1A) by way of at least one via structure (e.g., via structure 135-1A) that extends through an associated contact opening (e.g., opening 125-1A). In the disclosed embodiment, at a time T5 an inkjet head 170 is positioned over opening 125-1A and actuated to eject an ink quantity 175-1 to form metal via 135-1A in opening 125-1A such that it contacts structure 110-1A, and to form gridline 130A-1 on $Al_2O_3$ passivation layer 120A such that it contacts metal via 135-1A. Inkjet head 170 is then moved such that, at a time T6, inkjet head 170 is positioned over opening 125-2A and is then actuated to eject an ink quantity 175-2 such that metal via 135-2A is formed in opening 125-2A such that it contacts structure 110-1A, and then gridline 130A-2 is formed on $Al_2O_3$ passivation layer 120A such that it contacts metal via 135-2A. Alternatively, metal gridlines 130-1A and 130-2A are deposited using a non-lithographic printing method such as screen printing or co-extrusion.

Figure 3F:
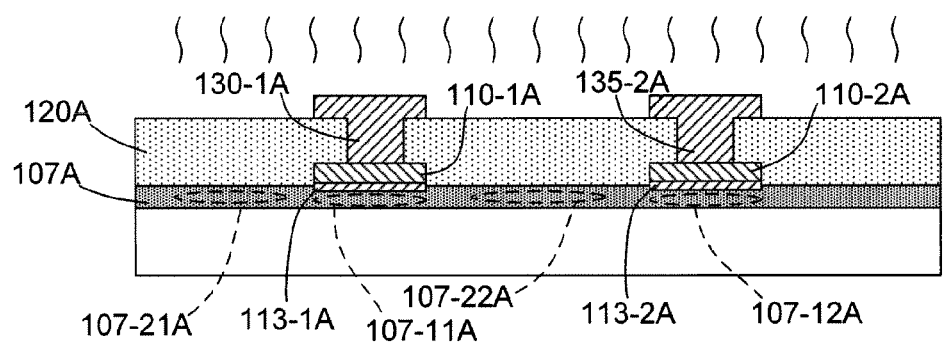

FIG. 3(F) is a simplified diagram illustrating a final firing (annealing) process that is performed after gridline formation. In the embodiment that silicide forming metal is used for the contact structure, it is expected during the firing process metal silicide structures 113-1A and 113-2A are respectively formed between each contact structure 110-1A and 110-2A and the underlying silicon p+ emitter layer 107A. In the embodiment that aluminum or another acceptor metal (e.g., B or Ga) is deposited first during the contact structure deposition, it is expected during the firing process aluminum diffuses into the p+ layer to form a selective emitter structure, that is, the regions of the emitter layer underlying the contact structure, regions 107-11A, 107-12A becomes a p++ region and have sheet resistance smaller than the regions not covered by the contact structures, such as regions 107-21A and 107-22A.

The present invention described above provides several advantages over conventional methods and solar cells. First, the method does not require any photolithography or wet chemical etching, making the method fast, clean, and low cost. Second, the use of contact structures greatly simplifies the production process. That is, while using laser ablation to make contact openings through an SiNx layer directly deposited on n+ emitter layer has been widely studied for p-type silicon solar cells and it has been approved that selective removal of the SiNx without damaging the underlying n+ emitter layer, the present inventors believe using the same laser ablation process to ablate an $Al_2O_3$ passivation layer will be very difficult because $Al_2O_3$ is a very stable material and has very large band gap (Crystalline $Al_2O_3$ has a band gap of ~8.8 eV and ALD amorphous $Al_2O_3$ has a band gap of ~6.4 eV). Because of this large band gap, much higher laser energy is needed to remove or ablate $Al_2O_3$, making it very difficult to only selectively remove $Al_2O_3$ without damaging or removing the underlying p+ emitter layer. By forming the contact structures between the $Al_2O_3$ passivation layer and the p+ emitter layer with a suitable thickness (i.e., the contact structures can be made significantly thicker than the p+ emitter layer, e.g., a few microns versus the typical 0.3 to 0.4 µm thickness of p+ emitter layers), the contact structures can be used to absorb any damage that would otherwise be caused by the high energy laser, thereby reliably preventing damage to the p+ emitter layer. The contact structures thus greatly improve the solar cell's tolerance for laser ablation, and thus improve production yields, as well as reduce the cost of the required laser system. Moreover, the present invention provides for very low contact resistances through the use of silicide-forming metals in the contact structures. Previous work has demonstrated that using nickel to form nickel silicide reduces the specific contact resistance by almost two orders of magnitude lower than conventional firing through silver paste. Finally, the present invention facilitates selective emitter structure formation by inkjet printing an acceptor metal such as Al, which will diffuse into p+ emitter layer to form a p++ region. This process will allow the formation of a selective emitter structure. It has been well known that a selective emitter structure can improve the absolute efficiency by about 1%.

Figure 4:
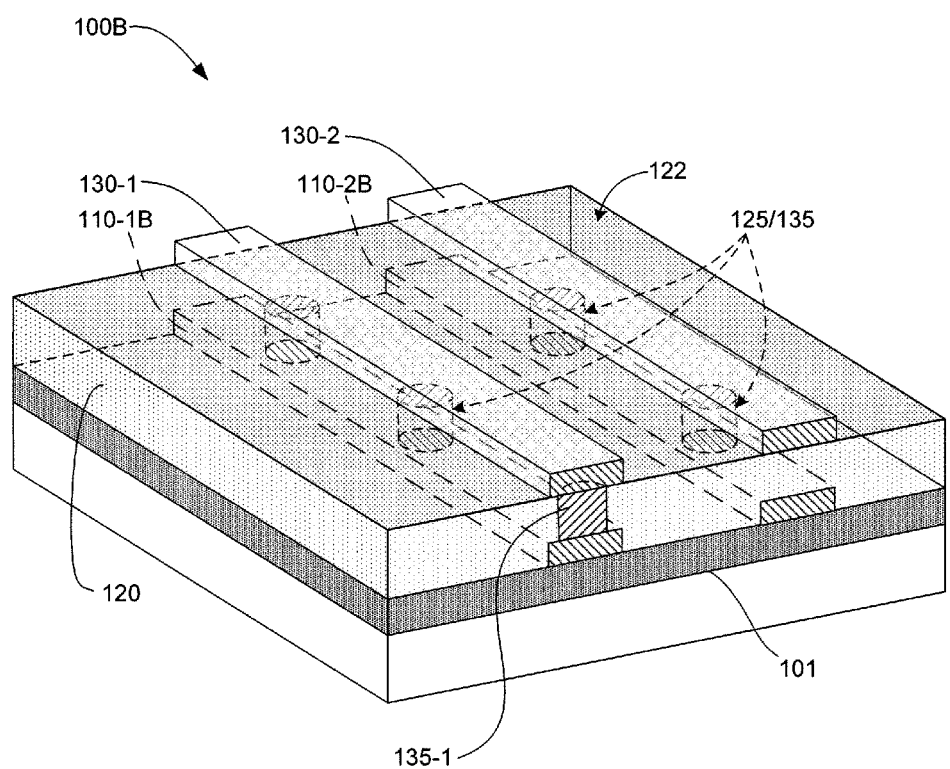
FIG. 4 is a top side partial cross-sectional perspective view showing a portion of a solar cell produced in according to another specific embodiment of the present invention.
Figure 5:
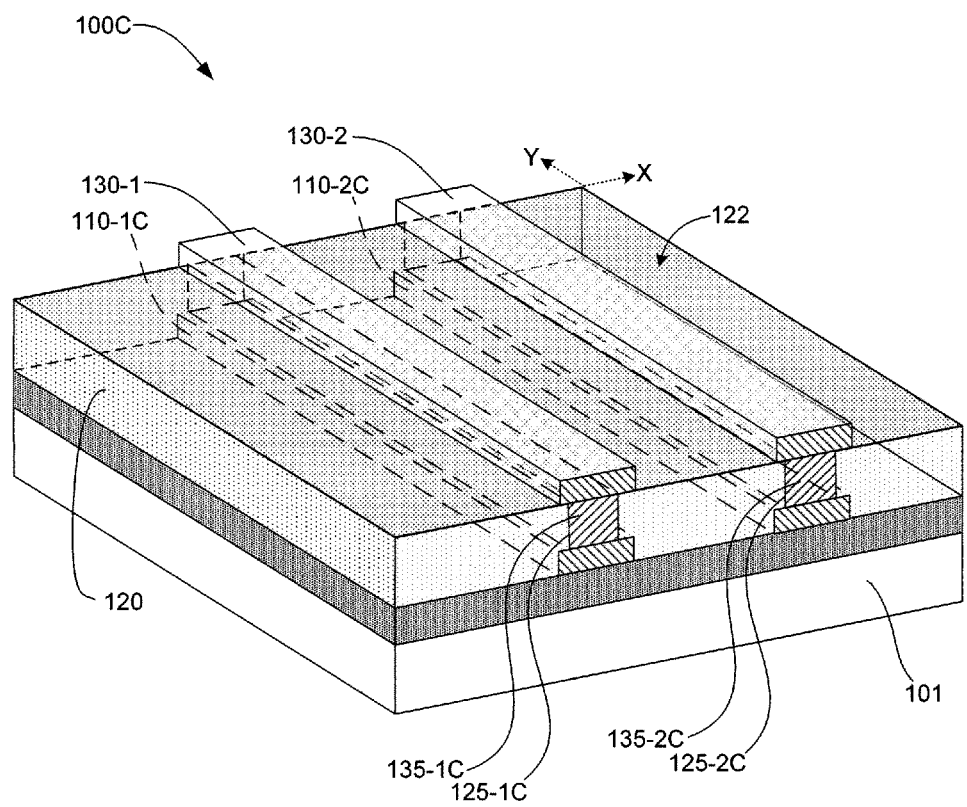
FIG. 5 is a top side partial cross-sectional perspective view showing a portion of a solar cell produced in according to another specific embodiment of the present invention.
Figure 6:
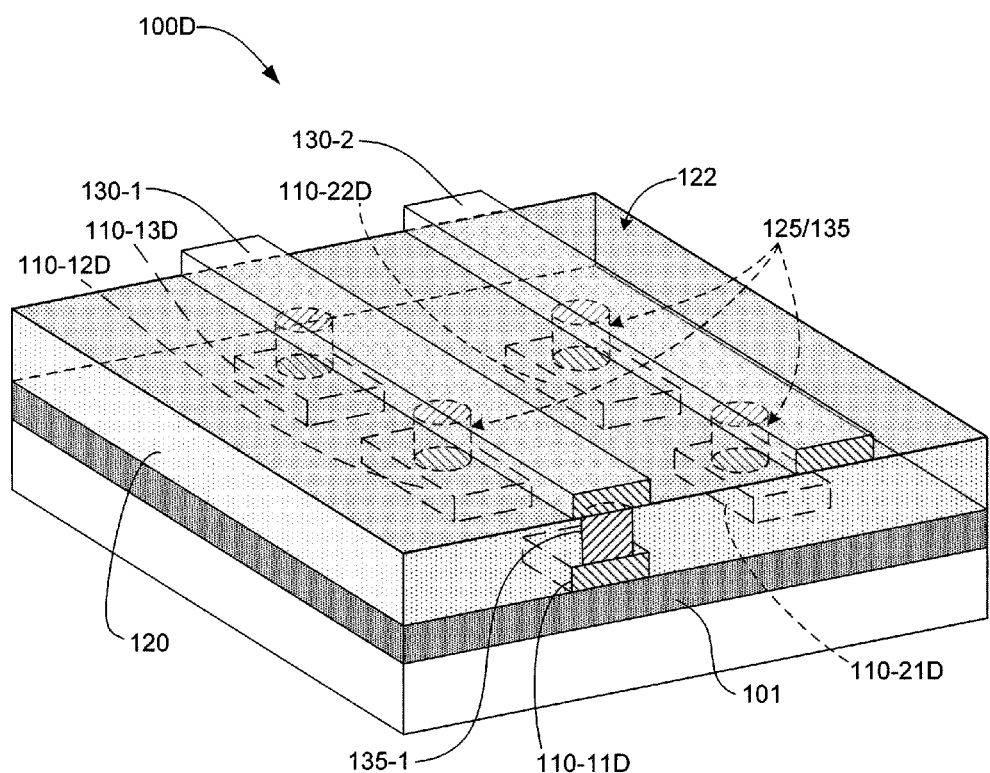
FIG. 6 is a top side partial cross-sectional perspective view showing a portion of a solar cell produced in according to yet another specific embodiment of the present invention.

Although the present invention has been described with respect to certain specific embodiments, it will be clear to those skilled in the art that the inventive features of the present invention are applicable to other embodiments as well. For example, in addition to depositing the spaced-apart contact structures in the form of spaced-apart dot structures (e.g., contact structures 110-1 and 110-2; see FIG. 1), the metal ink can be deposited in way that forms other structural patterns as well, all of which are intended to fall within the scope of the present invention. For example, FIG. 4 shows a solar cell 100B in which spaced-apart continuous line contact structures 110-1B and 110-2B are deposited on substrate 101 using the various methods described above, where via structures 135 are formed in associated contact openings 125 and extend through passivation layer 120 to provide electrical connections between gridlines 130-1 and 130-2 and substrate 101 by way of continuous line contact structures 110-1B and 110-2B. As indicated by solar cell 100C in FIG. 5, when contact structures 110-1C and 110-20 are formed as continuous lines, the contact openings 125-1C and 125-2C may be formed as continuous line openings, thereby facilitating the formation of continuous line via structures 135-1C and 135-2C under gridlines 130-1 and 130-2. Note that the widths of continuous line via structures 135-1C and 135-2C (i.e., measured in the X-axis direction) is smaller than the width of continuous line contact structures 110-1C and 110-2C for protection purposes (as described above). Alternatively, FIG. 6 shows a solar cell 100D in which spaced-apart contact structures 110-11D, 110-12D, 110-13D form a first dashed-line structure, and 110-21D and 110-22D form a second dashed-line structure. These dashed-line structures are deposited on substrate 101 using the various methods described above, and via structures 135 are formed in associated contact openings 125 and extend through passivation layer 120 to provide electrical connections between gridlines 130-1 and 130-2 and each dashed-line contact structure segment. Further, although the present invention is described with specific reference to the formation of ALD deposited $Al_2O_3$, the current invention can also be used in other dielectric material passivated solar cells and interdigitated back contact solar cells.

The invention claimed is:

1. A solar cell comprising:
   a semiconductor substrate having an upper surface and including a body layer and an emitter layer disposed between the upper surface and the body layer;
   a plurality of spaced-apart contact structures disposed over first portions of the upper surface, each of the plurality of spaced-apart contact structures having a minimum lateral dimension;
   a dielectric passivation layer disposed over the upper surface such that the dielectric passivation layer is disposed on the plurality of spaced-apart contact structures and on second portions of the upper surface disposed between the plurality of spaced-apart contact structures;
   a plurality of metal gridlines disposed on an upper surface of the passivation layer; and
   a plurality of metal via structures extending through associated openings defined in the passivation layer such that each metal via structure electrically connects an associated metal gridline of the plurality of metal gridlines and an associated contact structure of the plurality of contact structures,
   wherein each said associated opening defined in the passivation layer has a maximum lateral dimension that is smaller than the minimum lateral dimension of the associated contact structure.

2. The solar cell of claim 1, wherein the semiconductor substrate comprises an n-type body layer and a p+ emitter layer disposed between the upper surface and the n-type body layer.

3. The solar cell of claim 2, wherein the passivation layer comprises $Al_2O_3$.

4. The solar cell of claim 2, wherein the plurality of spaced-apart contact structures comprise one of a plurality of spaced-apart dot structures, a plurality of spaced-apart continuous-line structures, and a plurality of spaced dashed-line structures.

5. The solar cell of claim 1, further comprising a silicide structure disposed between each of the plurality of contact structures and said emitter layer.

6. The solar cell of claim 1, wherein a first sheet resistance of the emitter layer in first regions underlying said plurality of spaced-apart contact structures is less than a second sheet resistance of the emitter layer in second regions disposed between the plurality of spaced-apart contact structures.

7. The solar cell of claim 1, wherein the semiconductor substrate comprises a p-type body layer and an n+ emitter layer disposed between the upper surface and the p-type body layer.

8. A solar cell comprising: a silicon substrate having an upper surface, a body layer formed by a first semiconductor material disposed in said silicon substrate, and an emitter layer formed by a second semiconductor material and disposed between the upper surface and the body layer; a dielectric passivation layer disposed over the upper surface; a plurality of metal gridlines disposed on an upper surface of the passivation layer; and a plurality of metal via structures extending through an associated opening defined in the passivation layer such that each metal via structure electrically connects an associated metal gridline of the plurality of metal gridlines to an associated region of the emitter layer; wherein the solar cell further comprises a plurality of spaced-apart contact structures disposed on first portions of the upper surface such that the dielectric passivation layer is disposed on the plurality of spaced-apart contact structures and on second portions of the upper surface disposed between the plurality of spaced-apart contact structures, wherein the plurality of metal via structures and associated openings defined in the passivation layer are arranged such that each metal via structure electrically connects an associated metal gridline of the plurality of metal gridlines and an associated contact structure of the plurality of contact structures, and wherein each said associated opening has a diameter that is smaller than a width of the associated contact structure.

9. The solar cell of claim 8, wherein the semiconductor substrate comprises an n-type body layer and a p+ emitter layer disposed between the upper surface and the n-type body layer.

10. The solar cell of claim 9, wherein the passivation layer comprises $Al_2O_3$.

11. The solar cell of claim 9, wherein the plurality of spaced-apart contact structures comprise one of a plurality of spaced-apart dot structures, a plurality of spaced-apart continuous-line structures, and a plurality of spaced dashed-line structures.

12. The solar cell of claim 8, further comprising a silicide structure disposed between each of the plurality of contact structures and said emitter layer.

13. The solar cell of claim 8, wherein a first sheet resistance of the emitter layer in first regions underlying said plurality of spaced-apart contact structures is less than a second sheet resistance of the emitter layer in second regions disposed between the plurality of spaced-apart contact structures.

14. The solar cell of claim 8, wherein the semiconductor substrate comprises a p-type body layer and an n+ emitter layer disposed between the upper surface and the p-type body layer.

15. A solar cell including:
a silicon substrate having an upper surface;
a dielectric passivation layer disposed over the upper surface;
a plurality of metal gridlines disposed on an upper surface of the passivation layer; and
a plurality of metal via structures extending through an associated opening defined in the passivation layer such that each metal via structure electrically connects an associated metal gridline of the plurality of metal gridlines to an associated region of a p+ emitter layer;
wherein the silicon substrate comprises an n-type body layer and a p+ emitter layer disposed between the upper surface and the n-type body layer,
wherein the solar cell further comprises a plurality of spaced-apart contact structures disposed on first portions of the upper surface such that the dielectric passivation layer is disposed on the plurality of spaced-apart contact structures and on second portions of the upper surface disposed between the plurality of spaced-apart contact structures,
wherein the plurality of metal via structures and associated openings defined in the passivation layer are arranged such that each metal via structure electrically connects an associated metal gridline of the plurality of metal gridlines and an associated contact structure of the plurality of contact structures, and
wherein each said associated opening has a diameter that is smaller than a width of the associated contact structure.

16. The solar cell of claim 15, wherein the passivation layer comprises $Al_2O_3$.

17. The solar cell of claim 15, wherein the plurality of spaced-apart contact structures comprise one of a plurality of spaced-apart dot structures, a plurality of spaced-apart continuous-line structures, and a plurality of spaced dashed-line structures.

18. The solar cell of claim 15, further comprising a silicide structure disposed between each of the plurality of contact structures and said p+ emitter layer.

19. The solar cell of claim 15, wherein a first sheet resistance of the emitter layer in first regions underlying said plurality of spaced-apart contact structures is less than a second sheet resistance of the emitter layer in second regions disposed between the plurality of spaced-apart contact structures.

* * * * *